(12) United States Patent
Cadouri

(10) Patent No.: US 7,190,183 B1
(45) Date of Patent: Mar. 13, 2007

(54) SELECTING DIE PLACEMENT ON A SEMICONDUCTOR WAFER TO REDUCE TEST TIME

(75) Inventor: Eitan Cadouri, Cupertino, CA (US)

(73) Assignee: PDF Solutions, Inc., San Jose, CA (US)

( * ) Notice: Subject to any disclaimer, the term of this patent is extended or adjusted under 35 U.S.C. 154(b) by 46 days.

(21) Appl. No.: 10/799,061

(22) Filed: Mar. 12, 2004

Related U.S. Application Data

(60) Provisional application No. 60/453,859, filed on Mar. 12, 2003.

(51) Int. Cl.
*G01R 31/02* (2006.01)

(52) U.S. Cl. ..................................... 324/756

(58) Field of Classification Search ............... 324/537, 324/754, 756; 438/5, 8, 15, 17–18, 107; 29/712, 720, 832–833; 716/2, 4, 8
See application file for complete search history.

(56) References Cited

U.S. PATENT DOCUMENTS

| 5,654,204 | A  | * | 8/1997  | Anderson ............... 438/15 |
| 6,555,400 | B2 | * | 4/2003  | Farnworth et al. ...... 438/17 |
| 6,640,423 | B1 | * | 11/2003 | Johnson et al. ........ 29/740 |
| 6,703,170 | B1 | * | 3/2004  | Pindo .................. 716/19 |
| 6,777,971 | B2 | * | 8/2004  | Kirloskar et al. ...... 324/765 |
| 6,826,738 | B2 | * | 11/2004 | Cadouri ................ 716/8 |
| 6,841,796 | B2 | * | 1/2005  | Farnworth et al. ...... 257/48 |

* cited by examiner

*Primary Examiner*—Jermele Hollington
(74) *Attorney, Agent, or Firm*—Morrison & Foerster LLP

(57) ABSTRACT

A die placement of dies on a wafer is selected to reduce test time of the dies by obtaining a die placement and determining placements of a tester head needed to test the dies in the die placement. A number of touchdowns needed in the determined placements of the tester head is determined, where a touchdown involves lowering the tester head to form an electrical contact between pins on the tester head and bonding pads on a die being tested. The die placement is adjusted to reduce the number of touchdowns.

16 Claims, 3 Drawing Sheets

Figure 1:
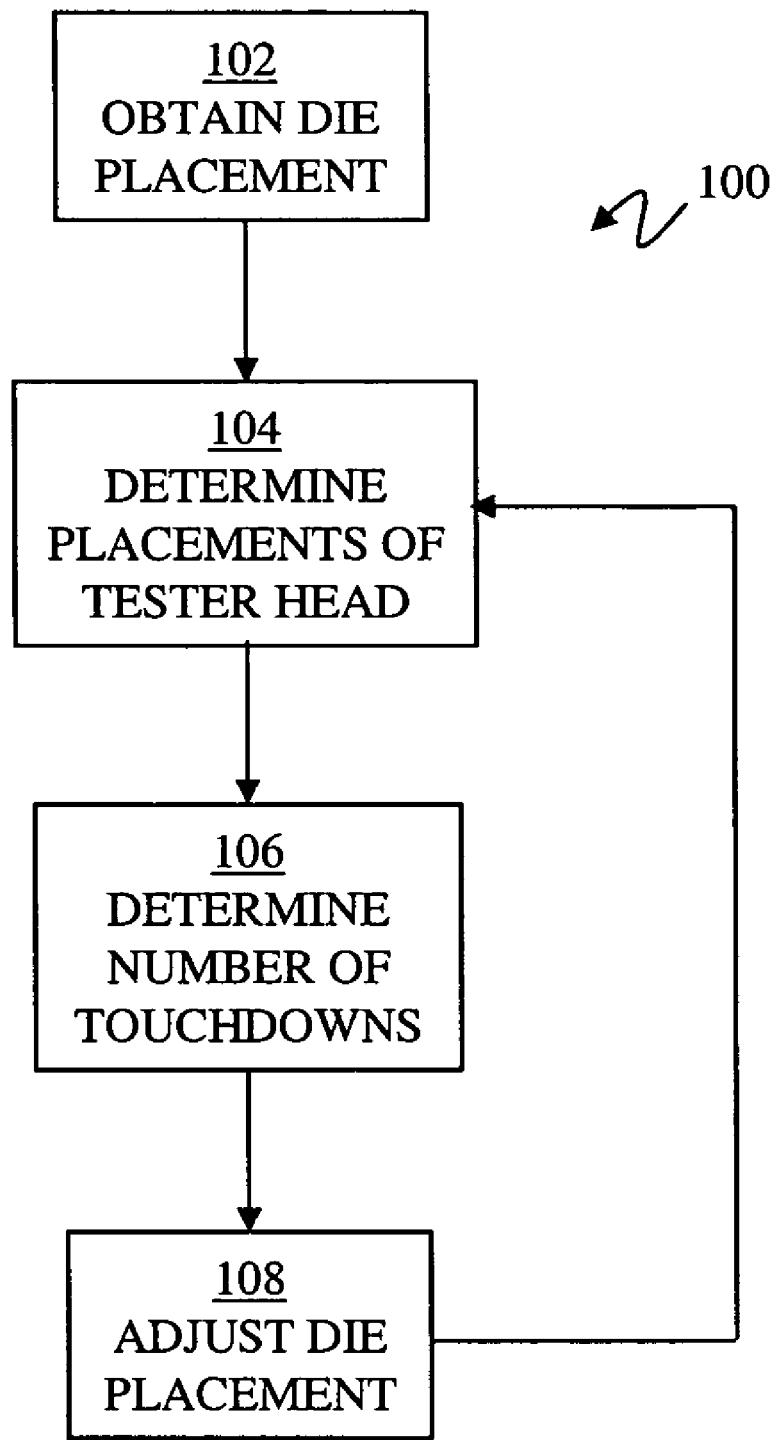

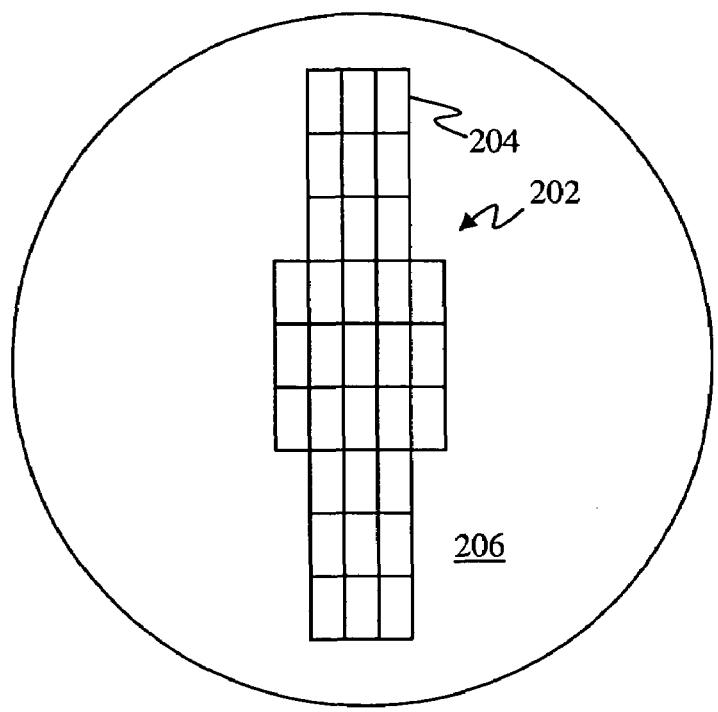
FIG. 2-A
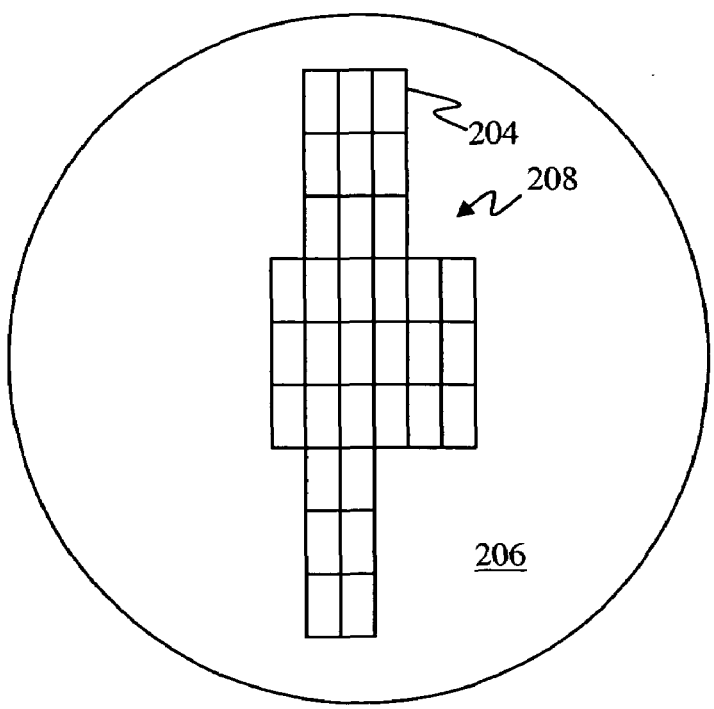
FIG. 2-B

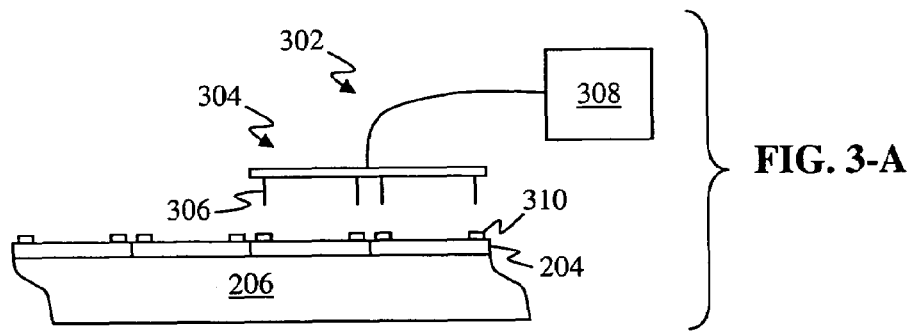
FIG. 3-A
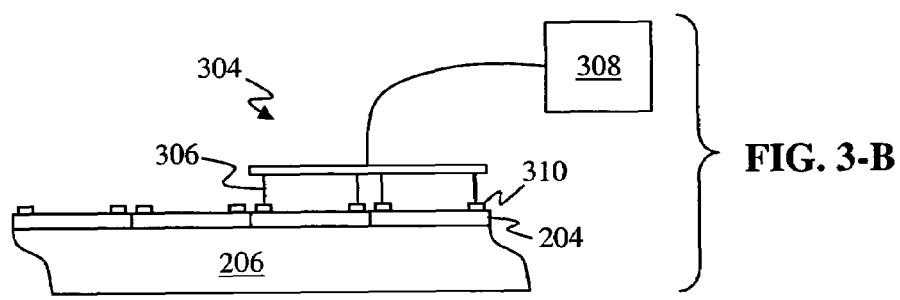
FIG. 3-B
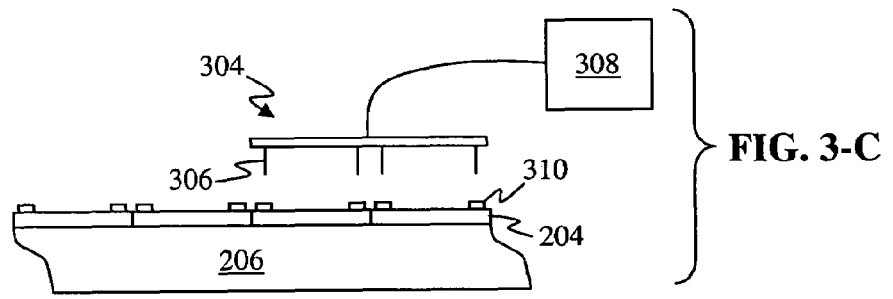
FIG. 3-C
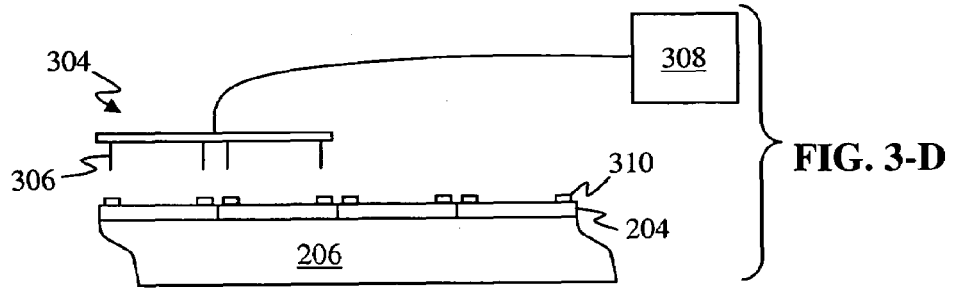
FIG. 3-D
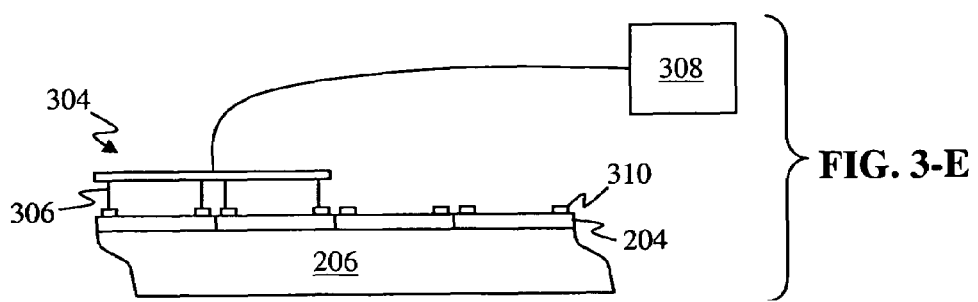
FIG. 3-E

SELECTING DIE PLACEMENT ON A SEMICONDUCTOR WAFER TO REDUCE TEST TIME

CROSS-REFERENCE TO RELATED APPLICATION

This application claims the benefit of U.S. Provisional Application No. 60/453,859, titled INCREASING THE THROUGHPUT OF TESTING DIES, filed Mar. 12, 2003, the entire content of which is incorporated herein by reference.

BACKGROUND

1. Field of the Invention

The present application relates to die placement on a semiconductor wafer, and more particularly to selecting a die placement to reduce test time of the dies on the semiconductor wafer.

2. Related Art

Semiconductor devices are typically manufactured by fabricating the devices on a semiconductor wafer. An individual device is formed as a die on the wafer using known semiconductor fabrication processes. Depending on the size of the die, a single wafer can contain hundreds of dies. The dies are generally arranged in a pattern (i.e., a die placement) on the wafer to maximize the number of dies on the wafer.

After the devices are fabricated on the wafer, the devices are electrically tested. The cost of testing can contribute to 30 percent and more of the overall cost of the devices. Semiconductor manufacturers are increasingly performing comprehensive testing of dies, meaning that each die is tested, while the dies are still on the wafer. This process enables the manufacturers to track the locations of the dies that fail or have low yield. However, performing comprehensive testing of dies increases the overall test time.

In one approach to reducing the amount of time needed to test the dies on a wafer, the tester used to test the dies is modified. In particular, the tester head is modified to adjust to a particular die placement. Modifying the tester head, however, can be difficult and expensive.

SUMMARY

In one exemplary embodiment, a die placement of dies on a wafer is selected to reduce test time of the dies by obtaining a die placement and determining placements of a tester head needed to test the dies in the die placement. A number of touchdowns needed in the determined placements of the tester head is determined, where a touchdown involves lowering the tester head to form an electrical contact between pins on the tester head and bonding pads on a die being tested. The die placement is adjusted to reduce the number of touchdowns.

DESCRIPTION OF DRAWING FIGURES

The present application can be best understood by reference to the following description taken in conjunction with the accompanying drawing figures, in which like parts may be referred to by like numerals:

FIG. 1 depicts an exemplary process of selecting a die placement to reduce test time;

FIGS. 2-A and 2-B depict exemplary die placements on a semiconductor wafer; and

FIGS. 3-A to 3-E depict an exemplary process of testing dies on a semiconductor wafer using a tester with a tester head.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

With reference to FIG. 1, an exemplary process 100 is depicted of selecting a die placement of dies on a wafer to reduce test time of the dies. In step 102, an initial die placement is obtained. For example, with reference to FIG. 2-A, an initial die placement 202 of dies 204 on a wafer 206 is depicted. It should be recognized that initial die placement 202 can include any number of dies 204 placed on wafer 206 in various patterns.

With reference again to FIG. 1, in step 104, placements of a tester head are determined for a die placement. In particularly, the placements of the tester head needed to test the dies in the die placement in accordance with a test program are determined.

For example, with reference to FIG. 2-A, assume that a test program to test dies 204 in initial die placement 202 requires that each die 204 be tested. With reference to FIG. 3-A, assume that dies 204 are electrically tested using exemplary tester 302. As depicted in FIG. 3-A, tester 302 includes a tester head 304, which is also often referred to as a probe card, connected to a test terminal 308. As also depicted in FIG. 3-A, tester head 304 includes a set of pins 306.

With reference to FIG. 3-B, to test die 204, tester head 304 is lowered to form an electrical contact between bonding pads 310 on die 204 and pins 306 at a test location on wafer 206. The process of lowering tester head 304 to form the electrical contact between bonding pads 310 and pins 306 is generally referred to as a touchdown. Test terminal 308 can then apply an electrical signal to test die 204.

As depicted in FIGS. 3-A and 3-B, the number and pattern of pins 306 on tester head 304 can corresponds to the number and pattern of bonding pads 310 on die 204 that are to be used in electrically testing die 204. As also depicted in FIGS. 3-A and 3-B, tester head 304 can be configured to simultaneously test a set of multiple dies 204 on wafer 206.

With reference to FIG. 3-C, after testing die 204 or a set of multiple dies 204, tester head 304 is raised to break the electrical connection between bonding pads 310 and pins 306. With reference to FIGS. 3-D and 3-E, tester head 304 can be positioned to test another die 204 or another set of multiple dies 204 at another test location.

In the side views of FIGS. 3-A to 3-E, a set of two dies 204 is depicted as being simultaneously tested using tester head 304. It should be recognized that tester head 304 can be configured to simultaneously test any number of dies 204 in various configurations.

For the sake of the present example, assume that tester head 304 is configured to simultaneously test six dies 204 in an array of 2×3 (i.e., two columns of dies 204 and three rows of dies 204). Thus, with reference to FIG. 2-A, in the present example, the placement of the die head can involve a raster type movement where six dies 204 in initial die placement 202 are tested in an array of two columns of dies 204 and three rows of dies 204 at a time.

With reference to FIG. 1, in step 106, the number of touchdowns is determined for the placements of the tester head determined in step 104. With reference to FIG. 2-A, in the present example of testing each die 204 with tester head 304 (FIG. 3-A), which can simultaneously test six dies 204 in an array of two columns of dies 204 and three rows of dies 204, the number of touchdowns needed is seven.

With reference to FIG. 1, in step 108, the die placement is adjusted to reduce the number of touchdowns, which in turn reduces the test time. For example, with reference to FIG. 2-B, an adjusted die placement 208 is depicted. Each die 204 of adjusted die placement 208 can be tested with tester head 304 (FIG. 3-A) using six touchdowns. The reduction in the number of touchdowns reduces the test time by the amount of time associated with moving and lowering tester head 304 (FIGS. 3-D and 3-E) at another test location.

With reference to FIG. 1, steps 104 to 108 can be iterated to determine a die placement with the minimum number of touchdowns and thus test time. Note that in iterating step 104, the placement of the tester head is determined for the die placement that was adjusted in the previous iteration of step 108.

Additionally, process 100 can be repeated for different test programs to determine a combination of die placement and test program with a minimum number of touchdowns and thus test time. Alternatively, process 100 can be repeated for different tester heads to determine a combination of die placement and tester head with a minimum number of touchdowns. Process 100 can also be repeated for different test programs and tester heads to determine a combination of die placement, test program, and tester head with a minimum number of touchdowns.

Although exemplary embodiments have been described, various modifications can be made without departing from the spirit and/or scope of the present invention. Therefore, the present invention should not be construed as being limited to the specific forms shown in the drawings and described above.

I claim:

1. A method of selecting a die placement of dies on a wafer to reduce test time of the dies, the method comprising:
   a) obtaining a die placement of dies on the wafer, wherein the die placement defines the locations on the wafer on which the dies are to be fabricated;
   b) determining placements of a tester head needed to test the dies in the die placement;
   c) determining a number of touchdowns needed in the determined placements of the tester head, wherein a touchdown involves lowering the tester head to form an electrical contact between pins on the tester head and bonding pads on a die being tested; and
   d) adjusting the die placement to reduce the number of touchdowns.

2. The method of claim 1 wherein steps b) to d) are iterated to obtain a die placement with a minimum number of touchdowns needed to test the dies in the die placement.

3. The method of claim 1, wherein the placements of the tester head are determined based on a test program.

4. The method of claim 3, wherein steps a) to d) are iterated for different test programs to determine a combination of die placement and test program with a minimum number of touchdowns.

5. The method of claim 4, wherein steps a) to d) are iterated for different tester heads to determine a combination of die placement test program, and tester head with a minimum number of touchdowns.

6. The method of claim 1, wherein steps a) to d) are iterated for different tester heads to determine a combination of die placement and tester head with a minimum number of touchdowns.

7. The method of claim 1, wherein the taster head is configured to simultaneously test a set of multiple dies.

8. A method of selecting a die placement of dies on a wafer to reduce test time of the dies, the method comprising:
   a) obtaining a die placement of dies on the wafer, wherein the die placement defines the locations on the wafer on which the dies are to be fabricated;
   b) obtaining a configuration of a tester head used to test the dies on the wafer;
   c) determining placements of the tester head needed to test the dies in the die placement using the configuration of the tester head;
   d) determining a number of touchdowns needed in the determined placements of the tester head; and
   e) adjusting the die placement to reduce the number of touchdowns.

9. The method of claim 8, wherein steps c) to e) are iterated to obtain a die placement with a minimum number of touchdowns needed to test the dies in the die placement.

10. The method of claim 8, wherein the placements of the tester head are determined based on a test program.

11. The method of claim 10, wherein steps a) to e) are iterated for different test programs of tester heads to determine a combination of die placement and test program with a minimum number of touchdowns.

12. The method of claim 11, wherein steps a) to e) are iterated for different configurations of tester heads to determine a combination of die placement, test program, and configuration of tester head with a minimum number of touchdowns.

13. The method of claim 8, wherein steps a) to e) are iterated for different configuration of tester heads to determine a combination of die placement and configuration of tester head with a minimum number of touchdowns.

14. A system of selecting a die placement of dies on a wafer to reduce test time of the dies, the system comprising:
   an initial die placement of dies on the wafer, wherein the initial die placement defines the locations on the wafer on which the dies are to be fabricated;
   a tester head having pins to contact bonding pads on a die on the wafer being tested; and
   an adjusted die placement, wherein the adjusted die placement is derived from the initial die placement by determining placements of the tester head needed to test the dies on the initial die placement and a number of touchdowns needed in the determined placements of the tester head, and wherein the adjusted die placement requires fewer touchdowns by the test head to test the dies on the adjusted die placement than the dies on the initial die placement.

15. The system of claim 14, wherein the initial die placement and the adjusted die placement have the sane number of dies.

16. The system of claim 14, wherein the tester head is configured to simultaneously test a set of multiples dies.

* * * * *